(12) United States Patent
Fuller et al.

(10) Patent No.: US 7,176,820 B1
(45) Date of Patent: Feb. 13, 2007

(54) MULTIPLE INPUT SIGMA-DELTA ARCHITECTURE

(75) Inventors: Arthur Thomas Gerald Fuller, Carp (CA); Bradley John Morris, Ottawa (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 11/235,946

(22) Filed: Sep. 27, 2005

(51) Int. Cl.
*H03M 3/00* (2006.01)

(52) U.S. Cl. .................................. 341/143; 341/155
(58) Field of Classification Search ......... 341/140–170
See application file for complete search history.

(56) References Cited

U.S. PATENT DOCUMENTS

| | | | | |
|---|---|---|---|---|
| 5,552,785 | A * | 9/1996 | Wilson et al. | 341/143 |
| 6,041,080 | A * | 3/2000 | Fraisse | 341/143 |
| 6,061,008 | A * | 5/2000 | Abbey | 341/143 |
| 6,518,905 | B2 * | 2/2003 | Siferd | 341/143 |
| 6,535,154 | B1 * | 3/2003 | Sculley | 341/143 |
| 6,987,953 | B2 * | 1/2006 | Morris et al. | 455/102 |

* cited by examiner

*Primary Examiner*—Rexford Barnie
*Assistant Examiner*—Lam T. Mai
(74) *Attorney, Agent, or Firm*—Withrow & Terranova, PLLC

(57) ABSTRACT

A number of parallel modulation functions are configured to provide sigma-delta modulation on a plurality of low sampling rate signals, which are representative of a high sampling rate input signal. Resultant sigma-delta modulated signals from each of the modulation functions are combined in a multiplexing fashion to create a high sampling rate output signal. The modulation functions may be interdependent, wherein error signals from the modulation functions are provided to a parallel block digital filter, which will provide a processed error signal to feed back into the input of each modulation function. The processed error signal for a given modulation function may be a function of the error signals derived from multiple ones of the modulation functions. In one embodiment, there are N modulation functions, and the operating rate of the modulation functions is $f_s/N$ wherein the sampling rate of the high frequency output signal is $f_s$.

20 Claims, 5 Drawing Sheets

MULTIPLE INPUT SIGMA-DELTA ARCHITECTURE

FIELD OF THE INVENTION

The present invention relates to signal processing, and in particular to providing a sigma-delta modulator architecture capable of effectively operating at higher frequencies.

BACKGROUND OF THE INVENTION

Sigma-delta modulators provide excellent analog-to-digital, digital-to-analog, and digital-to-digital conversion capabilities in an economical and efficient manner. One significant advantage of a sigma-delta modulator is that a high resolution input signal can be converted to a lower resolution signal using only a limited resolution quantizer. Unfortunately, high resolution can only be maintained for low and medium signal bandwidths. As such, sigma-delta modulators are mainly incorporated in devices where the bandwidth of the input signal is small relative to the operating rate of the sigma-delta modulator. Sigma-delta modulators are often found in audio applications and the like. The bandwidth restriction associated with sigma-delta modulators is indirectly due to the feedback path within a typical sigma-delta modulator architecture. Providing the feedback and the necessary processing associated therewith significantly limits the operating rate of the sigma-delta modulator. The restricted operating range corresponds to restricted bandwidths.

Normally, sigma-delta modulators are not used in wideband wireless applications, such as those requiring digital-to-analog conversion. Wideband wireless transmitters often incorporate lower speed digital-to-analog converters followed by an analog upconversion process and a conventional power amplifier. This traditional approach suffers from the normal limitations associated with analog circuitry, including component variations and temperature stability. The simplicity and cost effectiveness of sigma-delta modulators would be beneficial in wideband wireless applications to overcome these limitations; however, the large signal bandwidths and the high carrier frequencies have made sigma-delta modulators impractical.

Accordingly, there is a need for a way to incorporate sigma-delta modulators in wideband wireless applications and in other high-frequency applications in a cost-effective and efficient manner, while overcoming the traditional bandwidth limitations associated with sigma-delta modulators.

SUMMARY OF THE INVENTION

The present invention provides a sigma-delta architecture, which is capable of effectively operating at higher than traditional operating rates. In particular, a number of parallel modulation functions are configured to provide sigma-delta modulation (SDM) on a plurality of low sampling rate signals. These multiple low sampling rate signals are representative of a high sampling rate input signal. The low sampling rate signals may be generated from effectively demultiplexing a high sampling rate input signal or may be created in lieu of the high sampling rate input signal. The resultant sigma-delta modulated signals from each of the modulation functions are combined in a multiplexing fashion to create a high sampling rate output signal. Some, if not all, of the modulation functions are interdependent. This interdependency stems from the error signals from each of the modulation functions being provided to a parallel block digital filter, which will provide a processed error signal to feed back into the input of each modulation function. The processed error signal for a given modulation function may be a function of the error signals derived from multiple ones of the modulation functions. In one embodiment, there are N modulation functions, and the operating rate of the modulation functions is $f_s/N$ wherein the sampling rate of the high frequency output signal is $f_s$.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention provides a sigma-delta modulation architecture capable of operating efficiently and effectively in high bandwidth applications, including wideband wireless applications where input signal bandwidths are large and centered about high frequency carriers. Based on a required output sampling rate, a sigma-delta modulator architecture is decomposed into a number of parallel modulation functions, each of which provides sigma-delta modulation (SDM) at a much lower sampling rate. In particular, if the sampling rate of the output signal is $f_s$, there may be N modulation functions, which operate at a sampling rate of $f_s/N$. As such, sigma-delta modulation can take place at a lower operating rate in each of the parallel modulation function paths, and then the results may be combined to form an output signal operating at the desired operating rate. The N parallel modulation functions are interrelated and associated with a parallel block digital filter in a manner assuring that the effective sigma-delta transfer function is the same as if a single sigma-delta modulator architecture operating at the higher operating rate were employed.

Figure 1:
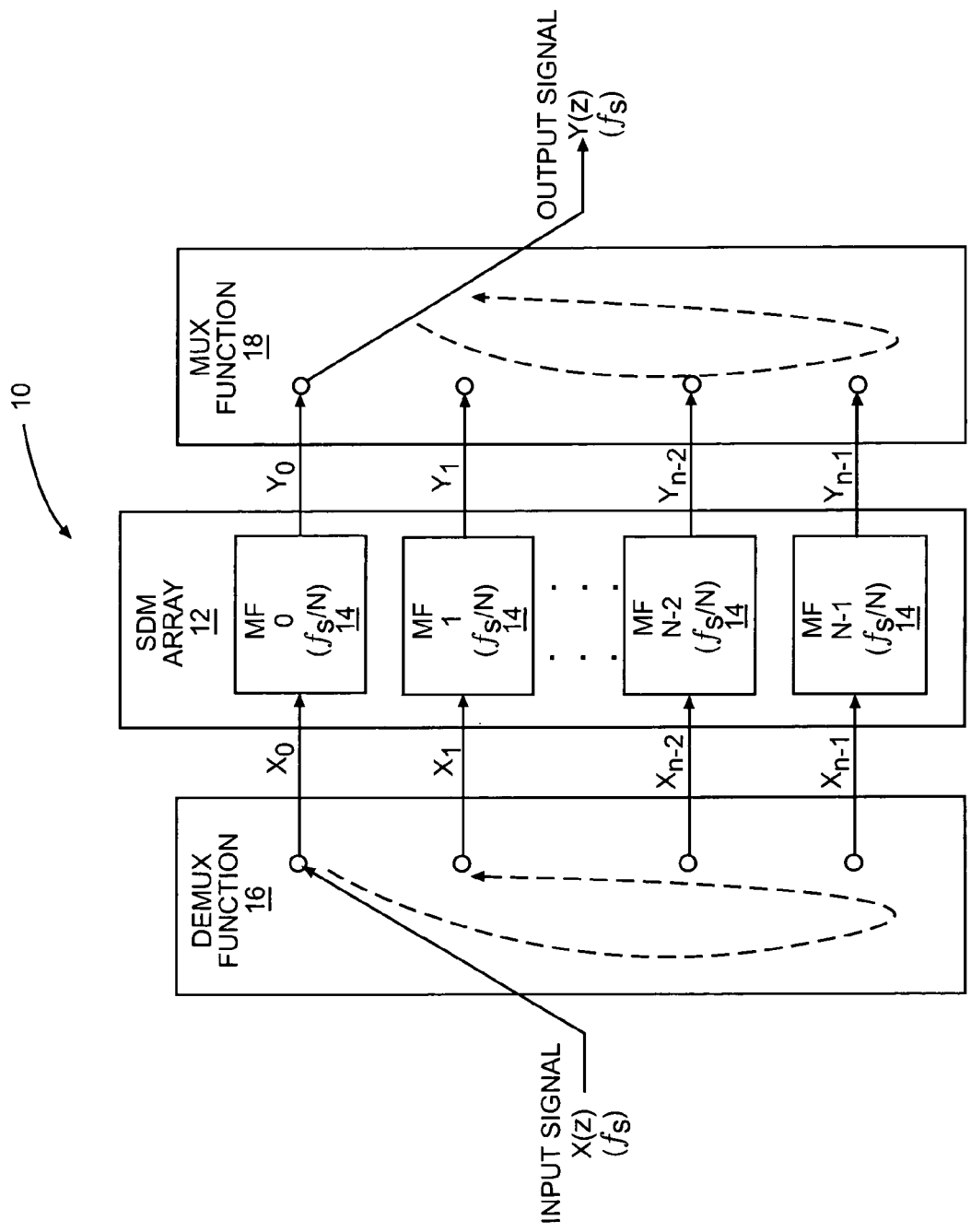
FIG. 1 is a block representation of a sigma-delta modulator architecture according to one embodiment of the present invention.

The overall concept of the present invention is illustrated in FIG. 1, where a basic sigma-delta architecture 10 is illustrated according to one embodiment of the present invention. At the heart of the sigma-delta modulator architecture 10 is an SDM array 12, which includes N modulation functions (MFs) 14, which operate at a frequency $f_s/N$. In essence, a demultiplexer (DEMUX) function 16 effectively demultiplexes a digitized input signal X(z), which was sampled at a sampling rate of $f_s$, amongst the N modulation functions 14. Accordingly, each modulation function 14 will receive every Nth sample and provide a sigma-delta modulation operation, which will be described in further detail below.

As with all sigma-delta modulator schemes, the number of bits used to represent the input signal is reduced, often to one or two bits, as those skilled in the art will appreciate. Accordingly, the signals provided to each of the modulation functions 14 are effectively quantized to provide modulated output signals. The quantization noise is filtered by the sigma-delta modulation and the resultant quantization signal is provided to a multiplexer (MUX) function 18, which will effectively assemble an output signal Y(z) from the outputs of the modulation functions 14. The output signal Y(z) will have an effective operating rate of $f_s$. The signal processing provided by the SDM array 12 will operate to provide a transfer function H(z) substantially the same as if only one sigma-delta modulator was used and was functioning at an operating rate of $f_s$. Thus, the present invention provides sigma-delta modulation by breaking the input signal into a plurality of lower operating rate parallel paths. Each path provides a modulation function 14, and the resultant outputs are combined to assemble an output signal operating at the desired operating frequency $f_s$. The demultiplexing function 16 and the multiplexing function 18 can be provided in various ways and in different contexts. The illustrations in FIG. 1 are merely logical illustrations used to convey the broad concepts of the present invention.

Figure 2:
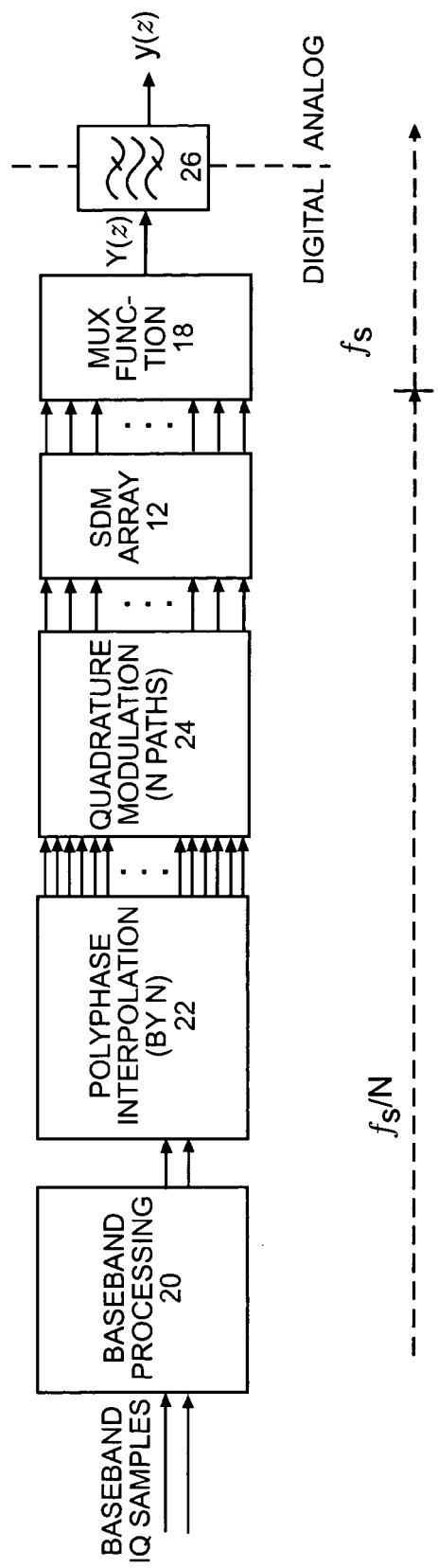
FIG. 2 is a block representation of a quadrature-based digital upconverter according to one embodiment of the present invention.

Turning now to FIG. 2, a block representation of a digital upconversion architecture for a wideband wireless application is illustrated. The upconversion architecture incorporates a multi-input sigma-delta modulator 12. Assume that the SDM array 12 has N paths, which are capable of providing modulation functions 14 (not shown). In this embodiment, assume that the in-phase (I) and quadrature phase (Q) samples of a baseband signal are respectively provided to a baseband processing function 20, which will provide the requisite baseband processing, including complex tuning, rate changing, coding, and the like, and will provide the resultant signals to a polyphase interpolation function 22. The baseband processing function 20 and the polyphase interpolation function 22 are operating at a rate of $f_s/N$. The polyphase interpolation function 22 will effectively upconvert the respective in-phase and quadrature phase sample streams by a factor of N, and will effectively provide interpolation between adjacent samples to provide additional samples sufficient for the upconversion. Accordingly, for every input sample received from the baseband processing function 20, the polyphase interpolation function 22 will provide N samples at an operating rate of fs/N. Each of the N samples form one of N sub-channels, which are provided to a quadrature modulation function 24.

As such, the quadrature modulation function 24 will receive N pairs of upconverted in-phase and quadrature phase signal pairs. The quadrature modulation function 24 will effectively provide N output signals, which represent the quadrature modulation of the in-phase and quadrature phase input signals. The N outputs of the quadrature modulation function 24 are provided to corresponding N inputs of the SDM architecture 10, which will provide the parallel sigma-delta modulation operations at the operating rate of $f_s/N$ and provide an output signal Y(z) having an operating rate of $f_s$. This one or multi-bit output signal may be used to drive filter circuitry 26 to effectively provide a digital-to-analog conversion, providing an analog output y(z). Again, the final output operating rate is achieved by combining the lower operating rate outputs of the parallel sigma-delta modulation paths provided by the SDM array 12. As such, only a small portion of the overall design is required to operate at the final operating rate required to generate the output signal y(z).

Figure 3:
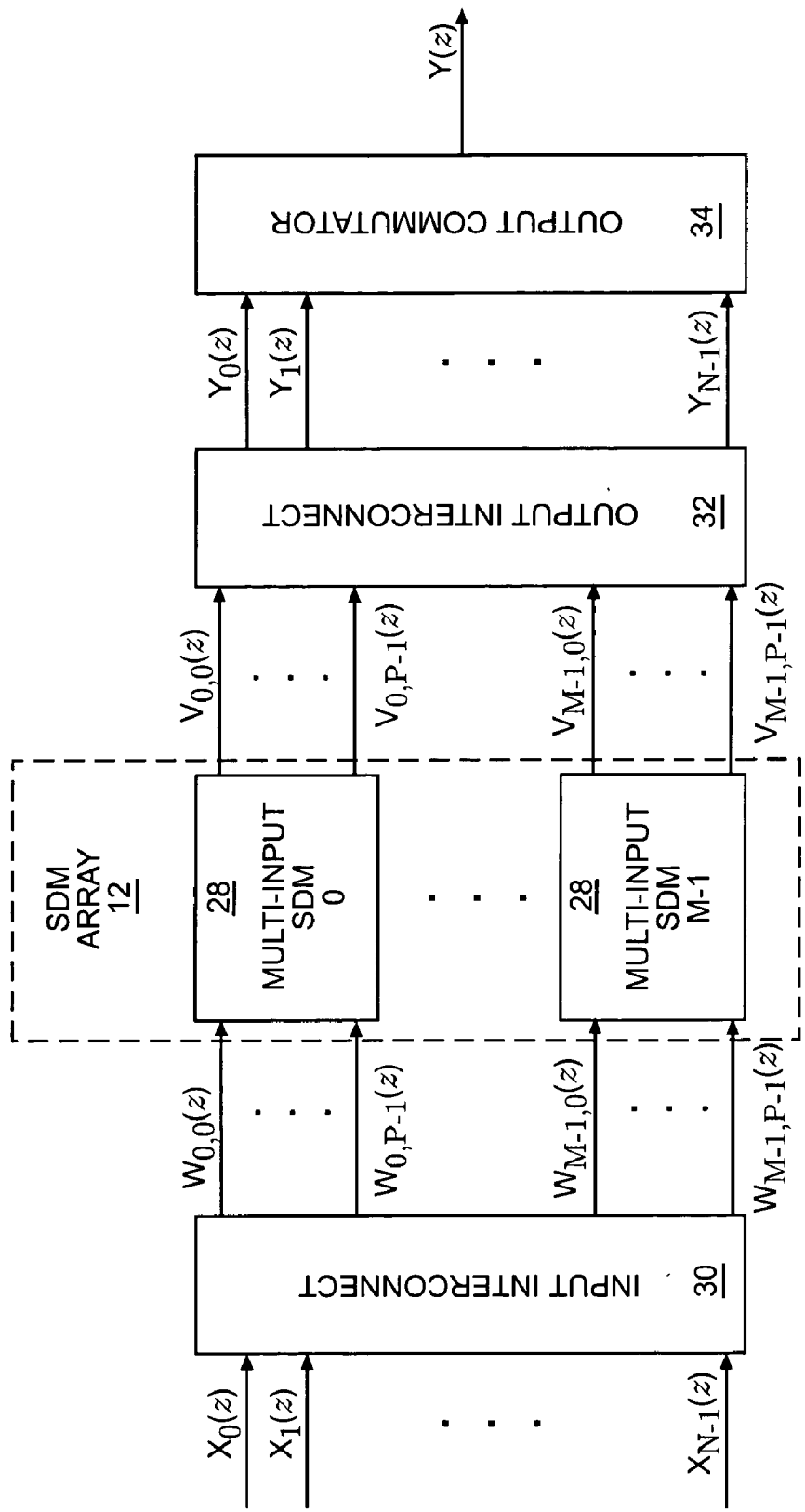
FIG. 3 is a block representation of a sigma-delta modulator architecture including multiple sigma-delta modulator sub-blocks according to one embodiment of the present invention.

With reference to FIG. 3, an embodiment providing the functionality of the SDM array 12 and the multiplexing function 18 is illustrated. In this embodiment, the SDM array 12 is made up of M multi-input SDM sub-blocks 28. There are N input signals to the SDM array 12. Each multi-input SDM sub-block 28 will include P inputs and P parallel but interdependent data paths, where P≦N. Each input $X_I(z)$ for I=0, 1, . . . , N−1 and the corresponding internal data paths operate at a sampling rate of R. Therefore, the final output rate of the output signal Y(z) is N*R. As illustrated, an input interconnect function 30 is shown to facilitate interconnection between each input signal $X_I(z)$ to the SDM array 12, and an output interconnect 32 is used to connect the output of the SDM array 12 to an output commutator 34, which effectively multiplexes the N signals emanating from the SDM array 12 to provide the output signal Y(z). The output interconnect 32 and the output commutator 34 provide the functionality of the multiplexing function 18 of FIG. 2.

The effective input signal provided to the overall architecture of FIG. 3 is given by:

$$X(z) = \sum_{l=0}^{N-1} X_l(z^N) z^{-1}, \quad \text{Eq. 1}$$

where $X_l(z)$ represents the z transform of the time domain inputs $x_l(n)$. In one embodiment of the invention, the input signals $X_l(z)$ are directly derived from the outputs of either polyphase interpolation filter phases or polyphase quadrature modulator phases.

The input interconnect 30 facilitates the connection of the inputs $X_I(z)$ to the parallel, but independent multi-input SDMs 28 as follows:

$$W_{i,j}(z) = X_{jM+i}(z), \quad \text{Eq. 2}$$

where $$i \in [0,1, \ldots, M-1], \quad \text{Eq. 3}$$

and $$j \in [0,1, \ldots, P-1]. \quad \text{Eq. 4}$$

Note that P and M must be chosen such that:

$$M \times P = N. \quad \text{Eq. 5}$$

Each of the M elements of the SDM array 12 may be substantially identical, and have a noise transfer function NTF(z) and a signal transfer function STF(z). Within the framework of the architecture illustrated in FIG. 3, the noise transfer function NTF(z) and signal transfer function STF(z) of the overall architecture is provided by:

$$NTF_{TOP}(z)=NTF(z^M) \quad \text{Eq. 6}$$

and $$STF_{TOP}(z)=STF(z^M), \quad \text{Eq. 7}$$

respectively. As such, M, NTF(z), and STF(z) may be chosen such that the overall signal and noise transfer functions have desired characteristics, which will vary from one environment to another. As an example, $NTF_{TOP}(Z)$ may have a band-stop filter characteristic, and $STF_{TOP}(z)$ may have an allpass filter characteristic centered at a target carrier frequency.

The multi-input SDM sub-block 28 may be derived by applying block digital concepts to a conventional error feedback-based sigma-delta modulator architecture. Further detail on the block digital concepts is provided in, "Multi-Rate Systems and Filter Banks," by P. P. Vaidyanathan, Inglewood Cliffs, N.J., 1993, which is incorporated herein by reference. Conventional error feedback architectures are highlighted in "Stable High-Order Delta-Sigma Digital-to-Analog Converters," by P. Kiss; J. Arias; D. Li; and V. Boccuzzi, IEEE Transactions on Circuits and Systems-I, vol. 51, issue 1, January 2004, pp. 200–205, which is also incorporated herein by reference.

Figure 4:
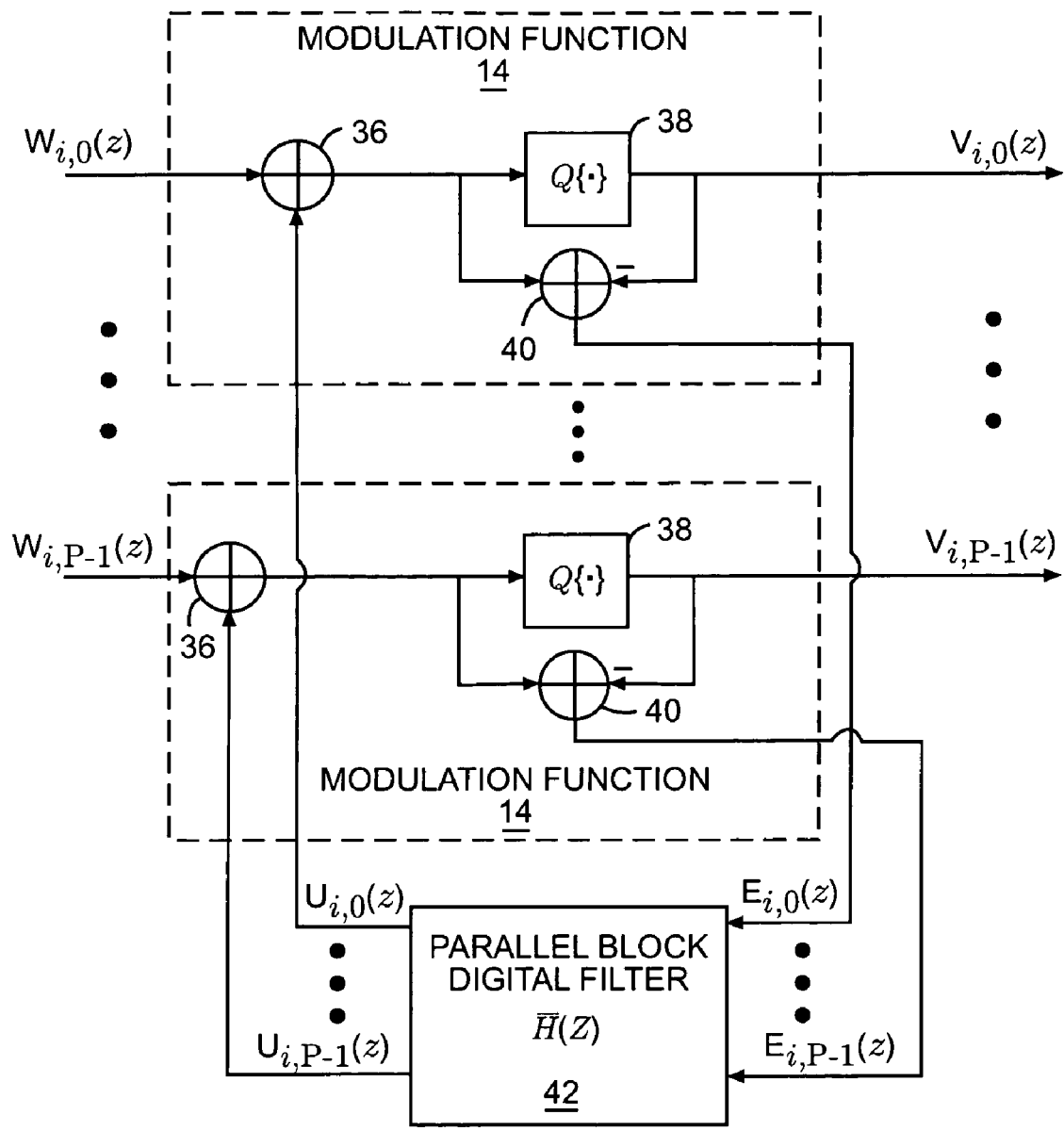
FIG. 4 is a logical representation of a multiple-input sigma-delta modulator architecture according to one embodiment of the present invention.

An example of applying block digital concepts to a traditional error feedback sigma-delta modulation architecture is provided in FIG. 4. The inputs to a given multi-input SDM sub-block 28 $W_{i,0}(z)$ through $W_{i,P-1}(z)$ are fed to corresponding data paths. Each data path will include summation circuitry 36, a quantization function 38, and a difference function 40. Those skilled in the art will recognize that an output feedback structure could be used instead of the error feedback architecture illustrated in FIG. 4. An output feedback architecture would not process feed forward and output signals. Instead, the output signal becomes the feedback signal, which is fed to a parallel block digital filter 42.

The multi-input SDM sub-block 28 will also include a parallel block digital filter 42. In operation, the input signals $W_{i,0}(z)$ through $W_{i,P-1}(z)$ are fed to the corresponding summation functions 36, which will add the input signals $W_{i,0}(z)$ through $W_{i,P-1}(z)$ to corresponding processed error signals $U_{i,0}(z)$ through $U_{i,P-1}(z)$, which are provided by the parallel block digital filter 42. The respective outputs of the summation functions 36 are provided to the respective quantization functions 38 and perhaps to the difference functions 40, depending on the configuration of the embodiment. Truncation may be used to provide the effective functionality of the quantization functions 38 and the difference functions 40 without requiring the subtraction operation. The truncated bits are used as the feedback signal. The outputs of the quantization functions 38 provide the outputs $V_{i,0}(z)$ through $V_{i,P-1}(z)$ of the multi-input SDM sub-block 28. The inputs and outputs of the quantization functions 38 are provided to the corresponding difference functions 40 to create corresponding error signals $E_{i,0}(z)$ through $E_{i,P-1}(z)$, which are fed to the parallel block digital filter 42. Based on the error signals $E_{i,0}(z)$ through $E_{i,P-1}(z)$, the processed error signals $U_{i,0}(z)$ through $U_{i,P-1}(z)$ are generated in accordance with:

$$\underline{U}_i(z)=\underline{H}(z)\underline{E}_i(z), \quad \text{Eq. 8}$$

where $$\underline{U}_i(z)=[U_{i,P-1}(z) \ldots U_{i,0}(z)]^T, \quad \text{Eq. 9}$$

$$\underline{E}_i(z)=[E_{i,P-1}(z) \ldots E_{i,0}(z)]^T, \quad \text{Eq. 10}$$

and where T is the transpose operator. The matrix $\overline{H}(z)$ is pseudocirculant in nature, with its $0^{th}$ row defined as:

$$[H_0(z)H_1(z) \ldots H_{P-1}(z)], \quad \text{Eq. 11}$$

where $$H_j(z) = \delta(j) - \sum_{n=0}^{\infty} ntf(Pn+j)z^{-n}, \quad \text{Eq. 12}$$

and where ntf(n) is the impulse response of the noise transfer function NTF(z). In this way, $H_j(z)$ describes the filter transfer functions that interconnect the parallel data paths within a multi-input SDM sub-block 28. Note that in order to avoid the creation of unrealizable delay-free loops, $H_0(z)$ must not have a non-zero $z^{-0}$ term. Therefore, for realizability of the prototype, it is required that:

$$ntf(0)=1. \quad \text{Eq. 13}$$

Furthermore, in the preferred embodiment, the impulse response ntf(n) is constrained to have integer values only. This facilitates the realization of the integer coefficients $H_j(z)$ using only adders (i.e. no multipliers), which allows for the pipelining of feedback loops as described in, "A 27-mW CMOS fractional-N synthesizer using digital compensation for 2.5-Mb/s GFSK modulation," by M. H. Perrott; T. L. Tewksbury III; and C. G. Sodini, IEEE Journal of Solid-State Circuits, Volume 32, Issue 12, December 1997, pages 2048–2060, which is incorporated herein by reference. This pipelining can dramatically improve the achievable operating rate of the SDM processing because the critical path through each multi-bit adder is reduced to a one-bit full adder.

The outputs $V_{i,j}(z)$ of the multi-input SDM sub-blocks 28 are formed into intermediate system outputs $Y_l(z)$ in accordance with:

$$Y_l(z)=V_{mod(l,M),\lfloor l/M \rfloor}(z), \quad \text{Eq. 14}$$

where $$l \in [0,1, \ldots, N-1]. \quad \text{Eq. 15}$$

The corresponding time-domain representation is given by:

$$y_l(n)=v_{mod(l,M),\lfloor l/M \rfloor}(n) \quad \text{Eq. 16}$$

The final output of the SDM modulator architecture is formed as:

$$y(n)=y_{mod(n,N)}(\lfloor n/N \rfloor), \quad \text{Eq. 17}$$

which has a sampling rate of N×R. The corresponding z-domain representation is given by:

$$Y(z) = \sum_{l=0}^{N-1} Y_l(z^N)z^{-1}. \quad \text{Eq. 18}$$

Note that in a digital hardware realization, the commutation function provided by the output commutator 34 can be implemented using an N-input multiplexer and associated control logic.

Figure 5:
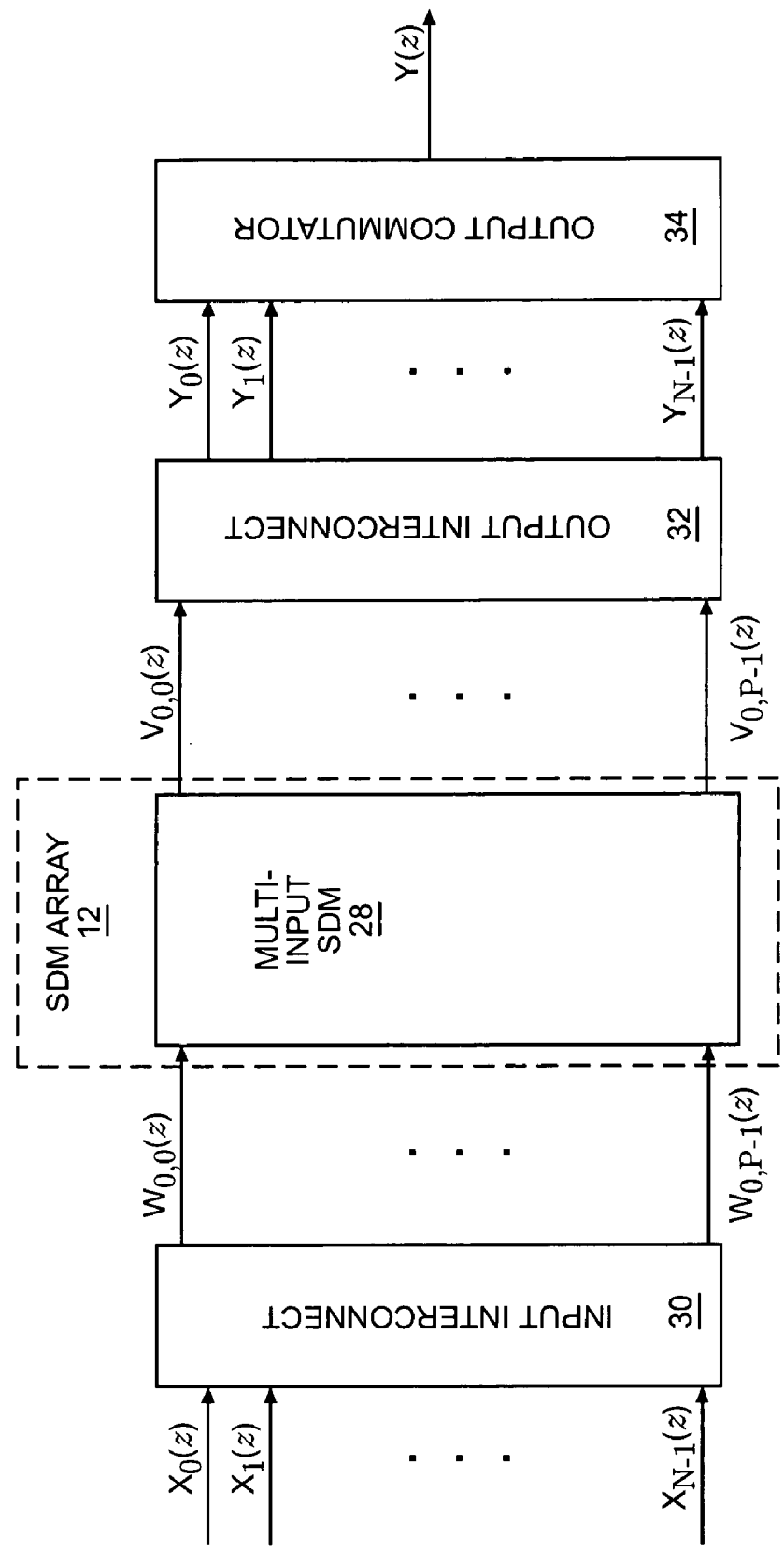
FIG. 5 is a block representation of a sigma-delta modulator architecture including a single multiple input sigma-delta modulator array according to one embodiment of the present invention.

With reference to FIG. 5, yet another embodiment of the present invention is illustrated wherein the SDM array 12 is essentially configured as having a single multi-input SDM 28. As such, each of the parallel data paths is provided in a common architecture. Thus, M=1 and P=N for the prior analysis of the respective signals mathematically described in association with FIGS. 3 and 4.

With the above embodiments, the limitations currently associated with sigma-delta modulator architectures can be overcome in a cost-effective and efficient manner. With the present invention, benefits of sigma-delta modulators can be achieved where input signal bandwidths are large and centered at high frequency carriers. Sigma-delta modulation processing will no longer be limited to situations where the bandwidth of the input signal is small relative to the operating rate of the sigma-delta modulation architecture. Accordingly, sigma-delta modulation architectures may be implemented in wideband wireless applications where input signal bandwidths are 60 MHz or more and centered at frequency carriers of 2.1 GHz or more. In these instances, the sigma-delta modulation operating rates among the parallel data paths may be an order of magnitude or more less than the final operating rate of the output signal.

Given the digital-to-digital nature of the sigma-delta modulation of the present invention, the concepts may be implemented in various types of applications. The output signals may be single bit output signals as well as multi-bit output signals. The single bit output embodiments may be used to drive conventional power amplifiers when the SDM architecture 10 is followed by an analog reconstruction filter. The single bit output may be used to directly drive a switching type amplifier. In multi-bit output embodiments, the output signal can be used to drive a multi-phase switching amplifier where the multi-level output is decoded to form switching waveforms for each of the constituent phases, which may be represented in the output signal.

Those skilled in the art will recognize improvements and modifications to the preferred embodiments of the present invention. All such improvements and modifications are considered within the scope of the concepts disclosed herein and the claims that follow.

What is claimed is:

1. A sigma-delta architecture comprising:
    a plurality of modulation functions, each modulation function adapted to provide sigma-delta modulation at a first operating rate on one of a plurality of low sampling rate signals to generate a plurality of sigma-delta modulated signals, the plurality of low sampling rate signals representative of a high sampling rate input signal; and
    combining circuitry adapted to combine the plurality of sigma-delta modulated signals to generate a high sampling rate output signal representative of providing sigma-delta modulation to the high sampling rate input signal at a second operating rate, which is higher than the first operating rate.

2. The sigma-delta architecture of claim 1 wherein at least two of the plurality of modulation functions are interdependent.

3. The sigma-delta architecture of claim 2 wherein error feedback paths for each of the at least two modulation functions share a common parallel block digital filter, providing a transfer function such that processed error feedback signals applied to corresponding ones of the plurality of low sampling rate signals are functions of error signals corresponding to the at least two modulation functions.

4. The sigma-delta architecture of claim 1 wherein when there are N of the low sampling rate signals, there are N of the modulation functions, and wherein the first operating rate is fs/N, and the second operating rate is fs.

5. The sigma-delta architecture of claim 1 further comprising a parallel block digital filter, and wherein each of the modulation functions comprises:
    summation circuitry adapted to sum one of the low sampling rate signals with a corresponding one of a plurality of processed error signals provided by the parallel block digital filter to generate a summation signal;
    quantization circuitry adapted to quantize the summation signal to provide one of the plurality of sigma-delta modulated signals; and
    error circuitry adapted to generate an error signal based on the one of the plurality of sigma-delta modulated signals,
wherein a plurality of error signals are generated and the parallel block digital filter is adapted to generate the plurality of processed error signals based a plurality of error signals.

6. The sigma-delta architecture of claim 5 wherein each of the plurality of processed error signals is a function of each of the error signals.

7. The method of claim 5 wherein the error circuitry generates the error signal based on a difference between the one of the plurality of sigma-delta modulated signals and the summation signal.

8. The sigma-delta architecture of claim 5 wherein the error circuitry generates the error signal by providing a pipelining process on the one of the plurality of sigma-delta modulated signals.

9. The sigma-delta architecture of claim 8 wherein the error circuitry generates the error signal by truncating least significant bits from the one of the plurality of sigma-delta modulated signals, such that the least significant bits represent the error signal.

10. The sigma-delta architecture of claim 1 further comprising circuitry adapted to:
    receive the high sampling rate input signal; and
    decompose the high sampling rate input signal into the plurality of low sampling rate signals.

11. The sigma-delta architecture of claim 1 further comprising a filter adapted to receive the high sampling rate output signal and provide an analog output signal.

12. The sigma-delta architecture of claim 1 wherein the plurality of low sampling rate signals are derived from at least one of the group consisting of a polyphase interpolation filter and a polyphase quadrature modulator.

13. The sigma-delta architecture of claim 1 wherein the high sampling rate output signal is used to create a wideband wireless communication signal.

14. The sigma-delta architecture of claim 1 wherein a noise transfer function associated with all or a group of the modulation functions has a noise transfer function having a band-stop characteristic centered at a desired carrier frequency for a transmitted signal derived from the high sampling rate output signal.

15. The sigma-delta architecture of claim 1 wherein a signal transfer function associated with all or a group of the modulation functions has a signal transfer function having an all-pass characteristic centered at a carrier frequency of a transmitted signal derived from the high sampling rate output signal.

16. The sigma-delta architecture of claim 1 wherein the plurality of low sampling rate signals are digitized signals represented by a series of multiple bit digital sample values.

17. The sigma-delta architecture of claim 1 wherein the high sampling rate output signal is a one-bit signal.

18. The sigma-delta architecture of claim 1 wherein the high sampling rate output signal is a multiple bit signal.

19. A method for providing sigma-delta modulation comprising:

in each of a plurality of paths, providing sigma-delta modulation at a first operating rate on one of a plurality of low sampling rate signals to generate a plurality of sigma-delta modulated signals, the plurality of low sampling rate signals representative of a decomposed high sampling rate input signal; and combining the plurality of sigma-delta modulated signals to generate a high sampling rate output signal representative of providing sigma-delta modulation to the high sampling rate input signal at a second operating rate, which is higher than the first operating rate.

20. The method of claim 19 wherein the modulation provided in at least two of the plurality paths is interdependent.

* * * * *